United States Patent [19]

Hart et al.

[11] Patent Number: 5,721,689

[45] Date of Patent: Feb. 24, 1998

[54] SYSTEM AND METHOD FOR PHASOR ESTIMATION AND FREQUENCY TRACKING IN DIGITAL PROTECTION SYSTEMS

[75] Inventors: David Hart, Raleigh; Yi Hu; Damir Novosel, both of Cary, all of N.C.; Robert Smith, Boyertown, Pa.

[73] Assignee: ABB Power T&D Company Inc., Raleigh, N.C.

[21] Appl. No.: 574,357

[22] Filed: Dec. 18, 1995

[51] Int. Cl.$^6$ .......................... G01R 23/10; H03M 1/00
[52] U.S. Cl. .................. 364/484; 364/487; 364/483; 364/570; 364/576; 341/123; 324/55
[58] Field of Search .................. 364/481, 483–485, 364/493, 576, 900, 487, 570; 324/76.11, 76.39, 76.52, 76.74, 76.55; 361/78, 79, 70; 322/23–25, 28; 341/122–123; 356/350

[56] References Cited

U.S. PATENT DOCUMENTS

| | | | |
|---|---|---|---|
| 3,755,734 | 8/1973 | Blanyer | 324/78 Z |
| 3,863,133 | 1/1975 | Pollard | 321/5 |
| 3,984,771 | 10/1976 | Nossen et al. | 324/83 D |
| 4,053,839 | 10/1977 | Knoedl, Jr. | 328/38 |
| 4,291,299 | 9/1981 | Hinz et al. | 340/347 AD |
| 4,319,329 | 3/1982 | Girgis et al. | 364/484 |
| 4,547,726 | 10/1985 | Premerlani | 324/78 Z |
| 4,672,555 | 6/1987 | Hart et al. | 364/483 |
| 4,715,000 | 12/1987 | Premerlani | 364/484 |
| 4,739,277 | 4/1988 | Hollister et al. | 328/55 |
| 4,774,621 | 9/1988 | Andow | 361/80 |
| 4,803,635 | 2/1989 | Andow | 364/483 |
| 4,815,002 | 3/1989 | Verbanets | 364/484 |
| 4,819,179 | 4/1989 | Klein | 364/484 |
| 4,827,259 | 5/1989 | Murphy et al. | 341/123 |
| 4,896,337 | 1/1990 | Bushy, Jr. | 375/118 |
| 4,939,761 | 7/1990 | Kuroda | 375/80 |
| 4,953,117 | 8/1990 | Lagadec | 364/724.1 |
| 5,017,860 | 12/1988 | Germer et al. | 324/142 |
| 5,151,869 | 9/1992 | Alcala | 364/497 |
| 5,179,376 | 1/1993 | Pomatto | 340/870.02 |
| 5,376,894 | 12/1994 | Petranovich | 329/306 |
| 5,378,979 | 1/1995 | Lombardi | 324/107 |
| 5,406,495 | 4/1995 | Hill | 364/483 |
| 5,453,903 | 9/1995 | Chow | 361/79 |
| 5,461,329 | 10/1995 | Linehan et al. | 324/772 |
| 5,544,065 | 8/1996 | Engel et al. | 364/484 |
| 5,559,689 | 9/1996 | Kirchberg et al. | 363/95 |
| 5,566,211 | 10/1996 | Choi | 375/332 |

OTHER PUBLICATIONS

"Field Experience with a Digital Relay for Synchronous Generators," 89 SM 731–1 PWRD.

"Performance Assessment of A new Digital Subsystem for Generator Protection," Presented on Oct. 13–14, 1994.

"A New Measurement Technique for Tracking Voltage Phasors, Local System Frequency, and Rate of Change of Frequency," IEEE Transactions on Power Apparatus and Systems, vol. PAS 102, No. 5, May, 1983.

"An Adaptive Sampling–Interval Generator for Digital Relaying," IEEE Transactions on Power Delivery, vol. 4, No. 3, Jul., 1989.

*Primary Examiner*—James P. Trammell
*Assistant Examiner*—Cuong H. Nguyen
*Attorney, Agent, or Firm*—Woodcock, Washburn, Kurtz, Mackiewicz & Norris LLP

[57] ABSTRACT

A method and system for estimating phasors and tracking the frequency of a signal is provided. The method uses a variable N-point DFT to compute one or more phasors based on data acquired from one or more sampled signals. At each sampling interval the change in phasor angle between the current sampling interval and the previous sampling interval is determined and used to estimate the instantaneous frequency of the signal. Instantaneous frequencies are averaged over a cycle of the signal. In addition, a number of discrete frequencies and corresponding DFT windows based on a fixed sampling rate and a predetermined fundamental frequency of the signal are defined and used in estimating the instantaneous frequency. Once the average cycle frequency is determined the DFT window is adjusted by setting it equal to the DFT window corresponding to the discrete frequency closest to the average cycle frequency.

20 Claims, 11 Drawing Sheets

SYSTEM AND METHOD FOR PHASOR ESTIMATION AND FREQUENCY TRACKING IN DIGITAL PROTECTION SYSTEMS

FIELD OF THE INVENTION

The present invention relates to frequency tracking in digital systems, and more particularly, to a new method of phasor estimation and frequency tracking in a generator protection unit.

BACKGROUND OF THE INVENTION

Digital protection systems are used, for example, in power systems to monitor the voltage and current signals provided by electrical generators. Such digital protection systems may be embodied in a generator protection unit (GPU). A GPU estimates voltage and current phasors based upon the voltage and current signals and from those phasors detect various fault conditions requiring system shut down. The phasors are also used for metering functions performed by remote users and for other power system control functions. Abnormal conditions may additionally be detected through relatively large changes in the generator's operating frequency. Accordingly, an adaptive technique for tracking the generator frequency is important for both generating accurate voltage and current phasors and for monitoring fault conditions in the generator by detecting a significant change in the generator frequency.

While the present invention will be described in the context of a GPU implementation, those of ordinary skill in the art will readily understand that the inventive techniques described herein may be implemented in a variety of systems in which signal phasors are generated and accurate adaptive frequency tracking is required.

FIG. 1 shows a GPU 20 and a generator 10. Voltage signals output from the generator ($V_{out}$) are sensed by voltage sensor 12. Potential transformers, resistive dividers, or the like, may be employed as voltage sensors. The sensed voltage signals are output from the voltage sensor to the GPU 20. It should be understood that the generator produces three-phase power, and accordingly, the voltage signals output from the generator may include $V_A$, $V_B$, and $V_C$, or alternatively may include line-to-line voltages $V_{AB}$, $V_{BC}$, and $V_{CA}$.

Current sensor 14 such as current transformers, may be used to sense current signals output from the generator ($I_{out}$) to both the GPU and to the power system. If, for example, the current output to the GPU and to the power system are not equal then a fault condition may exist. The sensed currents, which may include each line current $I_A$, $I_B$, and $I_C$, is provided as input to the GPU 20.

The GPU 20 includes A/D converter 15, digital signal processor (DSP) 16, microprocessor 17, and external interface 18. The A/D converter samples the sensed voltage and current signals and provides voltage and current samples to the DSP. The DSP may generate a voltage phasor each sampling interval by utilizing a discrete fourier transform (DFT) to be described in more detail below, and then tracks the operating frequency of the generator based on the generated phasors. Phasor data and frequency estimates are output from the DSP to the microprocessor.

The microprocessor uses this information to detect faults in the power system or generator malfunctions. If a fault or malfunction is detected the microprocessor outputs a signal through the external interface to a circuit breaker causing the circuit breaker to open its current carrying contacts so that the system is effectively shut down.

Users may wish to access the phasor and frequency estimates. For example, engineers may be required to monitor system performance for a variety of reasons. Accordingly, the phasor data and frequency estimates may be output from the DSP and stored by the microprocessor in a memory (not shown). If the data is then needed, it may be accessed by the user upon request which may be transmitted to the microprocessor via the external interface. The external interface may include an RS232 interface. The microprocessor transfers the stored data from the memory to the user via the external interface.

While other techniques may be used to generate the phasor data, the DFT is commonly used because it is very efficient in estimating a particular frequency. Consider the waveform $s(t)$ given by:

$$s(t) = B\cos(wt + \gamma) \quad (1)$$

Then, sampling at N samples per cycle, the waveform is given by:

$$S_k = S(t_k) = B\cos(\omega t_k + v) = B\cos\left(\frac{2\pi}{N}k + v\right) = B\cos(\psi k + v). \quad (2)$$

where $\psi$ is defined as $2\pi/N$ and the samples of $s(t_k)$ are:

$$S_0 = S(t_0) = B\cos(\omega t_0 + v) = \frac{B}{2}[e^{j(0+v)}e^{j(v)} + e^{-j(0+v)}e^{-j(v)}] \quad (3)$$

$$S_1 = S(t_1) = B\cos(\omega t_1 + v) = \frac{B}{2}[e^{j(1+v)}e^{j(v)} + e^{-j(1+v)}e^{-j(v)}] \quad (4)$$

.
.
.

$$S_{N-1} = S(t_{N-1}) = B\cos(\omega t_{N-1} + v) = \quad (5)$$

$$\frac{B}{2}[e^{j((N-1)+v)}e^{j(v)} + e^{-j((N-1)+v)}e^{-j(v)}]$$

Multiplying each sample by corresponding $e^{-j(k\psi)}$(k=0,N−1) and summing, then rearranging, results in the DFT formula given by:

$$Be^{j(v)} = \frac{2}{N}\sum_{K=0}^{N-1} S_k e^{-j(k\psi)} \quad (6)$$

Note that the rms value requires division by a factor of the square root of 2.

The above description of the DFT assumes an integer samples per cycle N, resulting in a sampling frequency $f_s=(N*f)$, where f is the fundamental frequency, e.g., the expected operating frequency of the generator when fully energized. The fundamental frequency is related to the DFT window and may be an assumed value. With a sampling frequency of 60×32 Hz, the DFT calculation with a 32 sample window will have a fundamental frequency of 60 Hz. For the same $\Delta t$, a window of N=22 samples, the DFT fundamental frequency is 87.27 Hz. Thus, the sampling frequency is an integer multiple of the fundamental frequency. The actual generator frequency varies from the DFT fundamental frequency by an amount $\Delta f$. Application of the DFT when $f_a$ is not an integer of the fundamental will introduce an "error" in the phasor estimate. This error is used to estimate the actual frequency using the deviation from fundamental frequency.

Considering the signal defined by equation (1) where $\omega$ is defined as $2\pi(f+\Delta f)$, and $f_a=(Nxf)$. Applying the DFT equation results in:

$$DFT = \frac{2}{N} \sum_{k=0}^{N-1} S_k e^{-j(k\psi)} = Be^{j(\gamma)} \frac{\sin\left(\frac{\pi \Delta f}{f}\right)}{N\sin\left(\frac{\pi \Delta f}{fN}\right)} e^{j\left(\frac{\pi \Delta f}{f} - \frac{\pi \Delta f}{fN}\right)} + \quad (7)$$

$$Be^{-j(\gamma)} \frac{\sin\left(\frac{-\pi \Delta f}{f}\right)}{N\sin\left(-\frac{\pi \Delta f}{fN} - \frac{2\pi}{N}\right)} e^{j\left(-\frac{\pi \Delta f}{f} + \frac{\pi \Delta f}{fN} + \frac{2\pi}{N}\right)}$$

From the above equation, it is easy to determine that if the input signal is at frequency f, and Δf is zero and the equation simplifies to equation (6). It is also important to note that γ is the offset angle and will vary depending on when the DFT estimate begins. Therefore, equation (7) can be expressed as follows:

$$DFT = \frac{2}{N} \sum_{k=0}^{N-1} S_k e^{-j(k\psi)} = k_1 P + k_2 P^* e^{j\left(-\frac{2\pi}{N}\right)} \quad (8)$$

where $$k_1 = \frac{\sin\left(\frac{\pi \Delta f}{f}\right)}{N\sin\left(\frac{\pi \Delta f}{fN}\right)}, k_2 = \frac{\sin\left(\frac{\pi \Delta f}{f}\right)}{N\sin\left(\frac{\pi \Delta f}{fN} + \frac{2\pi}{N}\right)}, \quad (9)$$

$$P = Be^{j(\gamma)} e^{j\left(\frac{\pi \Delta f}{f} - \frac{\pi \Delta f}{fN}\right)}$$

and where P is the complex phasor and P* is the complex conjugate of P. An exemplary phasor diagram is shown in FIG. 2. Note that each phasor is indicative of the instantaneous magnitude, angular frequency and phase of the signal at the time of sampling.

For frequency estimation, the input signal is assumed to be at the fundamental frequency f. The actual generator frequency is determined by computing Δf, then adjusting the frequency estimate.

A simplification of equations (7) and (8) may be used for the estimation of the frequency. If the frequency deviation is small, then sin(θ) approaches θ. Under this condition, equations (7) and (8) simplify to:

$$DFT = \frac{2}{N} \sum_{k=0}^{N-1} S_k e^{-j(k\psi)} = Be^{j(\gamma)} \frac{\frac{\pi \Delta f}{f}}{N\frac{\pi \Delta f}{fN}} e^{j\left(\frac{\pi \Delta f}{f} - \frac{\pi \Delta f}{fN}\right)} + 0 = \quad (10)$$

$$Be^{j(\gamma)} e^{j\left(\frac{\pi \Delta f}{f} - \frac{\pi \Delta f}{fN}\right)}$$

In the above equation, the values of N and f are known. Δf is an unknown which must be determined to calculate the actual operating frequency. FIG. 3 shows the sampled waveform of the signal represented by equation (1). The cosine waveform has an offset angle of 0 degrees when sampled at instant $t_k$. Using the previous cycle of data, the DFT is computed according to equation (10). A new sample is acquired at instant $t_{k+1}$ when the waveform has a new offset angle β. The offset angle between two consecutive samples (shown in FIG. 3) is given by:

$$\beta = e^{j\left(\frac{2\pi(f+\Delta f)}{fN}\right)} \quad (11)$$

Thus, the ratio of two consecutive DFT estimates is given by:

$$\frac{DFT(t_k+1)}{DFT(t_k)} = \frac{Be^{j(\gamma)} e^{j\left(\frac{\pi \Delta f}{f} - \frac{\pi \Delta f}{fN}\right)} e^{j\left(\frac{2\pi(f+\Delta f)}{fN}\right)}}{Be^{j(\gamma)} e^{j\left(\frac{\pi \Delta f}{f} - \frac{\pi \Delta f}{fN}\right)}} \quad (12)$$

Ignoring the magnitude and examining the argument yields:

$$arg\left(\frac{DFT(t_k+1)}{DFT(t_k)}\right) = \theta = \frac{2\pi(f+\Delta f)}{fN} \quad (13)$$

By determining the DFT at different points in time, the angle difference from the two DFT estimates can be used to compute the actual operating frequency given by f+Δf. Solving equation (13) for f+Δf yields:

$$f+\Delta f = \theta * f * N/2\Pi \quad (14)$$

One known technique for tracking the generator frequency is to track the frequency, then adjust the sampling rate in order to maintain a fixed number of samples per cycle. Thus, if the GPU acquired 12 samples per 60 Hz cycle, the sampling interval, Δt, would be 1.388 msecs. If the frequency changed to 30 Hz, the sampling interval, Δt, would be adjusted to 2.77 msecs. However, the DFT window N would remain unchanged.

A flowchart of the steps carried out according to this prior frequency tracking procedure is shown in FIG. 4. The routine obtains a new sample at step 102 and increments a counter at step 104. A voltage phasor is generated at step 106 using an N-point DFT during each sampling interval. This phasor is also compared with a reference phasor to obtain the angle Θ at step 106. If the frequency has drifted a sufficient amount, Θ will be larger than a preset limit, LIMIT1, as determined at step 108. According to this technique, Θ is the angle between the reference phasor and the latest phasor estimate and is specified by M*N times the consecutive value, i.e., $$arg\left(\frac{DFT(t_k)}{referenceDFT}\right) = \theta = MN\frac{2\pi(f+\Delta f)}{fN} \quad (15)$$

where M cycles (M*N samples) have been accumulated. When the angle exceeds LIMIT1, the frequency deviation Δf is computed at step 112. However, to reduce the effect of transients on the frequency estimate, the frequency deviations are limited to +/−5 Hz at step 116 if Δf exceeds 5 Hz as determined at step 114. The sampling interval Δt is then adjusted to obtain N samples per cycle at the new frequency at step 118 and the new phasor estimate becomes the reference phasor. At this point, M is also reset to 0. Note that if the waveform is in the steady state and no deviation is detected, the reference phasor is updated after a predetermined number of sampling intervals, LIMIT2, at step 110.

While the aforementioned technique provides reasonably good frequency tracking capabilities using a simple N-point DFT and thus only requires a single set of DFT coefficients, it also has numerous disadvantages and shortcomings. For example, the variable DFT window requires an adjustable sampling rate that can be costly and relatively complex to implement through a variable A/D sampling circuit. Moreover, all of the data and samples must be stored noting the variable sampling interval along with the variable DFT window used to compute the phasor data thereby complicating the system's storage and display requirements as well as adding complexity to the data analysis and manipulation.

Still further, while this technique limits the effects of transients it still tracks the transients causing unnecessary error in the frequency estimates. Specifically, if a transient occurs during a single cycle, the frequency estimate is adjusted by +/−5 Hz—a relatively large adjustment. If during the next cycle, the transient has dissipated, frequency tracking is resumed based on an estimated frequency containing a relatively large error. Moreover, if the transient persists for several cycles, then it may seriously degrade frequency tracking once the transient has substantially subsided.

Additionally, this technique does not provide adequate harmonic rejection. Thus frequency estimates associated with harmonics in the sampled signals may result in the aforementioned adjustments associated with transients. The effects of large adjustments associated with harmonics may be profound while the generator is ramping up to its normal operating frequency.

Importantly, if this technique fails to track the frequency properly the varying sampling interval $\Delta t$ can exceed a critical interval such that required sampling data is missed. Thus time-domain back up functions may be ineffective or impossible to implement using this frequency tracking technique.

Therefore, there is a need for accurate frequency tracking and phasor estimation in a GPU in the presence of transients and harmonics that also reduces the data manipulation and storage requirements of the system.

SUMMARY OF THE INVENTION

The present invention fulfills these needs by providing a method of tracking the frequency of a signal including the following steps: sampling the signal at a predetermined fixed sampling rate to generate a sequence of N successive samples; determining for each successive sample the phase angle of the signal; determining the change in phase angle of the signal based upon the difference between the phase angle corresponding to a current sample and the phase angle corresponding to the most previous sample; estimating the instantaneous frequency of the signal based upon the change in phase angle; and adjusting N based on the estimated frequency.

In a preferred embodiment, an N-point DFT is performed for each successive sample thereby generating a phasor indicative of the instantaneous magnitude, angular frequency, and phase angle of the signal. The change in phase angle is then the argument of the phasor corresponding to the current sample to the phasor corresponding to the most previous sample.

According to the invention, a range of discrete frequencies $f_n$ is preferably defined such that each discrete frequency in the range is the predetermined fixed sampling rate divided by a multiple integer of samples $N_n$, wherein the multiple integer of samples is the number of samples per cycle of the corresponding discrete frequency based on the predetermined fixed sampling rate. The instantaneous frequencies are also preferably averaged over each cycle resulting in an average cycle frequency. The instantaneous frequency corresponding to a current sample $f(k)$ can then be estimated according to the following relationship:

$$f(k)=\theta(k)*(f_n*N_n/2\pi)$$

where $\theta(k)$ is the change in phasor angle, $f_n$ is the discrete frequency closest to the previous average cycle frequency and $N_n$ is the number of samples per cycle corresponding to the discrete frequency. More preferably, a maximum number of successive samples Nmax is defined. For each $N_n$ that does not exceed Nmax all of the $N_n$ samples are utilized in determining the phase angle of the signal. For each $N_n$ greater than Nmax, a predetermined number of samples $N_{skip}$ are skipped so that the N samples used in determining the phase angle of the signal exclude $N_{skip}$ samples between each of the N samples and $N_n$ is reduced by the factor of $(N_{skip}+1)$. The instantaneous frequency can then be estimated according to the following relationship:

$$f(k)=\theta(k)*(f_n*N_n*(N_{skip}+1)/2\pi)$$

The inventive method may be particularly advantageous when implemented in a GPU. In accordance with the invention, a method of tracking the operating frequency of an electrical generator in a generator protection unit (GPU) is also provided. This method includes the steps of: sampling the voltage signals output from the generator at a predetermined fixed rate to produce a set of voltage samples at N successive sampling intervals where N is the number of samples per cycle of the voltage signals; generating a phasor representative of the positive sequence voltage of the plurality of voltage signals during each successive sampling interval;

determining the change of the angle of the phasor generated during the current sampling interval and the angle of the phasor generated during the most previous sampling interval; estimating the instantaneous frequency of the generator based on the change of the angle; and adjusting N based on the instantaneous frequencies. Preferably, the instantaneous frequencies are averaged over a cycle of the voltage signals to produce an average cycle frequency and N is adjusted based on the average cycle frequency.

More preferably, the step of generating the phasor is carried out using at least one N-point DFT and the inventive method includes the steps of: generating a predetermined pairing of discrete frequencies $f_n$ and corresponding number of samples $N_n$ such that $f_n*N_n$ is equal to the fixed predetermined sampling rate; identifying the discrete frequency closest to the average cycle frequency; and selecting the number of samples $N_n$ corresponding to the identified discrete frequency and defining the number of samples N to be the number of samples $N_n$ for the next cycle.

The difference between the average cycle frequency associated with a current cycle and the average cycle frequency associated with the most previous cycle is preferably determined for transient control. A transient block counter is preferably incremented if the frequency shift is greater than a predetermined threshold and the average cycle frequency adjusted by a predetermined frequency adjustment when the transient block counter exceeds a predetermined value. In a more preferred embodiment, the predetermined threshold and the predetermined frequency adjustment are each about 5 Hz, and the predetermined value is ten.

According to the invention, the operating frequency of the generator is preferably tracked when the operating frequency is between about 16 Hz and 87 Hz. The maximum number of successive samples preferably does not exceed 38 samples.

The invention also provides a method for tracking the generator frequency while the generator frequency is ramping up. According to this aspect of the invention, a fundamental frequency and an initial number of samples per first cycle $N_i$ associated with the fundamental frequency are defined; a determination whether the instantaneous frequency corresponding to $N_i$ is less than the fundamental frequency during the first cycle is made; the instantaneous frequencies over the first cycle are averaged to produce a first average cycle frequency; a number of additional sampling intervals required to complete one cycle of the first average cycle frequency is determined; the instantaneous frequency for each additional sampling interval is estimated; and the instantaneous frequencies and additional instantaneous frequencies are averaged to produce an updated average cycle frequency, where N is adjusted based on the updated average cycle frequency.

A generator protection system for analyzing voltage and current signals output from a generator using the inventive methods is also provided. The generator protection system according to the invention includes a sampling means for receiving an input of the signals and sampling them at a predetermined fixed rate to provide an output of sampled signals, and a signal processor coupled to the sampling means to receive an input of the sampled data and for estimating the operating frequency of the generator by carrying out at least one N-point DFT where N corresponds to the DFT window to provide an instantaneous frequency estimate. According to the invention, the signal processor varies N based on the instantaneous frequency estimate.

BRIEF DESCRIPTION OF THE DRAWINGS

The present invention will be better understood, and its numerous objects and advantages will become apparent by reference to the following detailed description of the invention when taken in conjunction with the following drawings, in which.

DETAILED DESCRIPTION OF THE INVENTION

Figure 5:
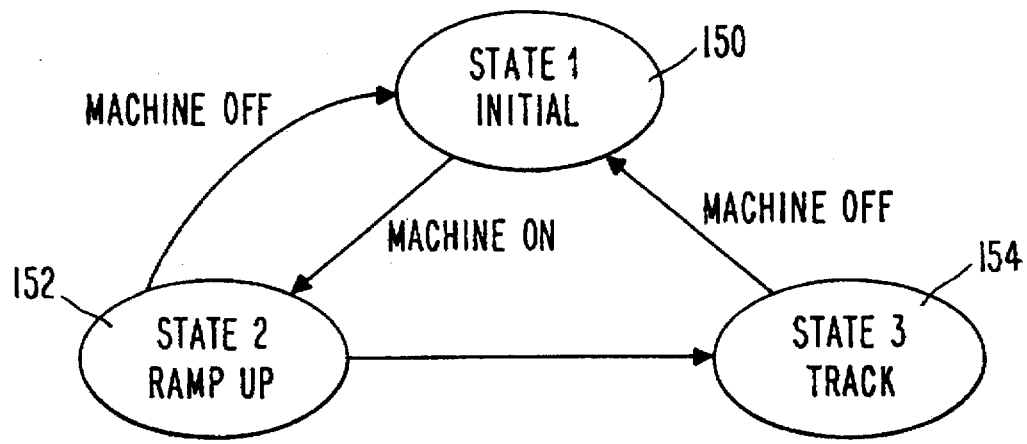
FIG. 5 shows a state diagram of the overall frequency tracking procedure implemented in a GPU in accordance with the present invention.

FIG. 5 shows a state diagram of the overall frequency tracking procedure implemented in a GPU in accordance with the present invention. During the initial state at 150, the signal samples are monitored to check for a "non-zero" condition indicating that the generator has been energized, i.e. the generator has been turned on and current has been supplied (referred to hereinafter as a "machine on condition"). Once a machine on condition has been detected, the procedure advances to the next state, generator ramp up at 152. During the generator ramp up state, frequency tracking is commenced using special procedures to be described in detail below until the generator is ramped up to its fundamental frequency, i.e. the anticipated operating frequency when fully energized. In other words, if the operating frequency of the generator should be 60 Hz when fully energized, the fundamental frequency is defined herein as 60 Hz. During the ramp up state the generator frequency is tracked and a DFT window is determined even if the frequency has not reached the fundamental frequency.

Once the ramp up frequency has been tracked for a full cycle, the procedure advances to the next state, tracking at 154. During tracking, phasors are generated and the frequency estimated thereby tracking any variations in the operating frequency. Since any such variations should be relatively small, transient control is preferably implemented. During both the generator ramp up state 152 and the tracking state 154, the sampled signals may be monitored to detect a "machine off condition" in which the generator has been shut down or has failed. Once a machine off condition is detected the procedure returns to the initial state 150.

Figure 6:
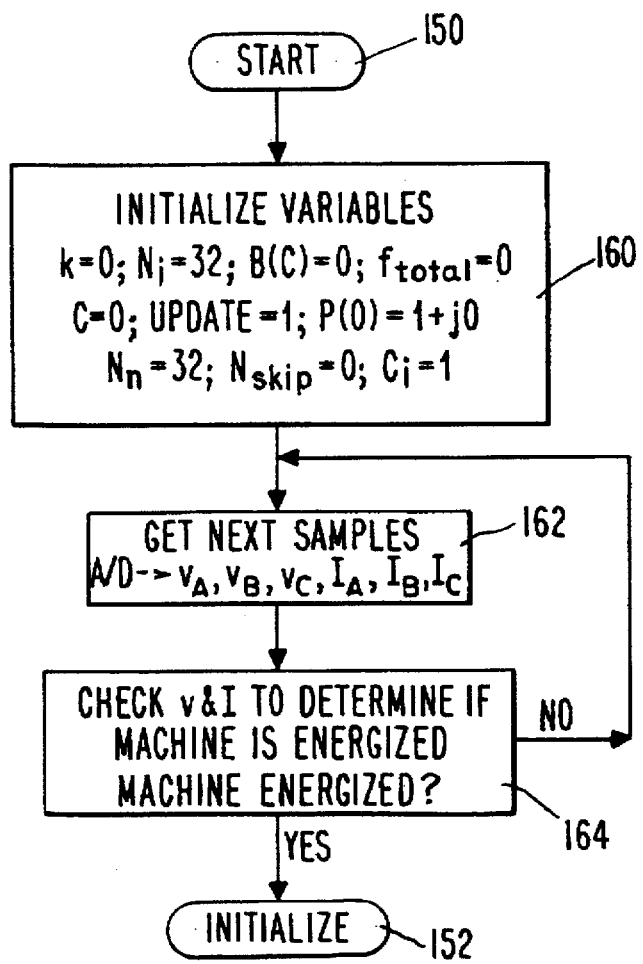
FIG. 6 shows a flow chart of the steps carried out by the tracking procedure during the initial state in accordance with a preferred embodiment of the invention.

FIG. 6 shows a flow chart of the steps carried out by the tracking procedure during the initial state in accordance with a preferred embodiment of the invention. As shown in FIG. 6, a number of program variables are initialized at step 160 as follows: the sample counter (k) is initialized to 0; the initial number of samples per cycle ($N_i$) which will be equivalent to the first DFT window N is set to 32; the block transient counter, B(C), which is described below is set to 0; the accumulated frequency ($f_{total}$) also described below is set to 0; an initial cycle flag ($C_i$) used in the ramp up procedure is set to 1; an initial update flag (UPDATE) used in the ramp up procedure is set to 1; a cycle counter C is set to 0; P(0) an initial phasor is set equal to the complex value 1+j0; the average cycle frequency ($f_{new}(C)$) which is described in detail below is set to 60 Hz. Corresponding values of $N_n$ and $N_{skip}$ from Table 1 which is explained below, are 32 and 0, respectively. The samples output from the A/D converter are monitored at step 162 until a "non-zero" set of samples is detected at 164 indicating a "machine on condition." Once a machine on condition is encountered the tracking procedure advances to the generator ramp up state 152.

Figure 7A:
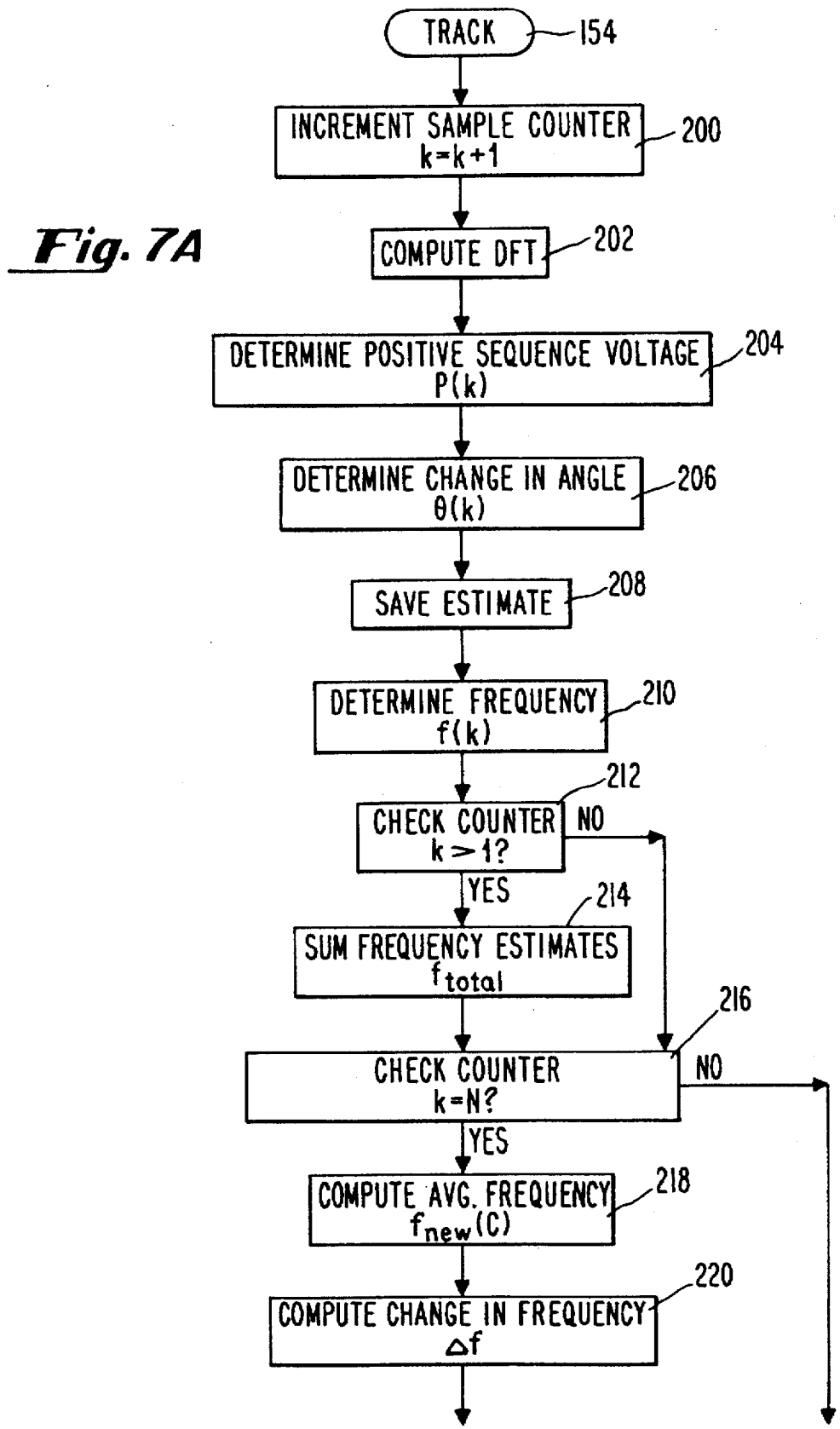
FIGS. 7A and 7B show a flow chart of the steps carried out during the frequency tracking state in a preferred embodiment of the present invention.
Figure 7B:
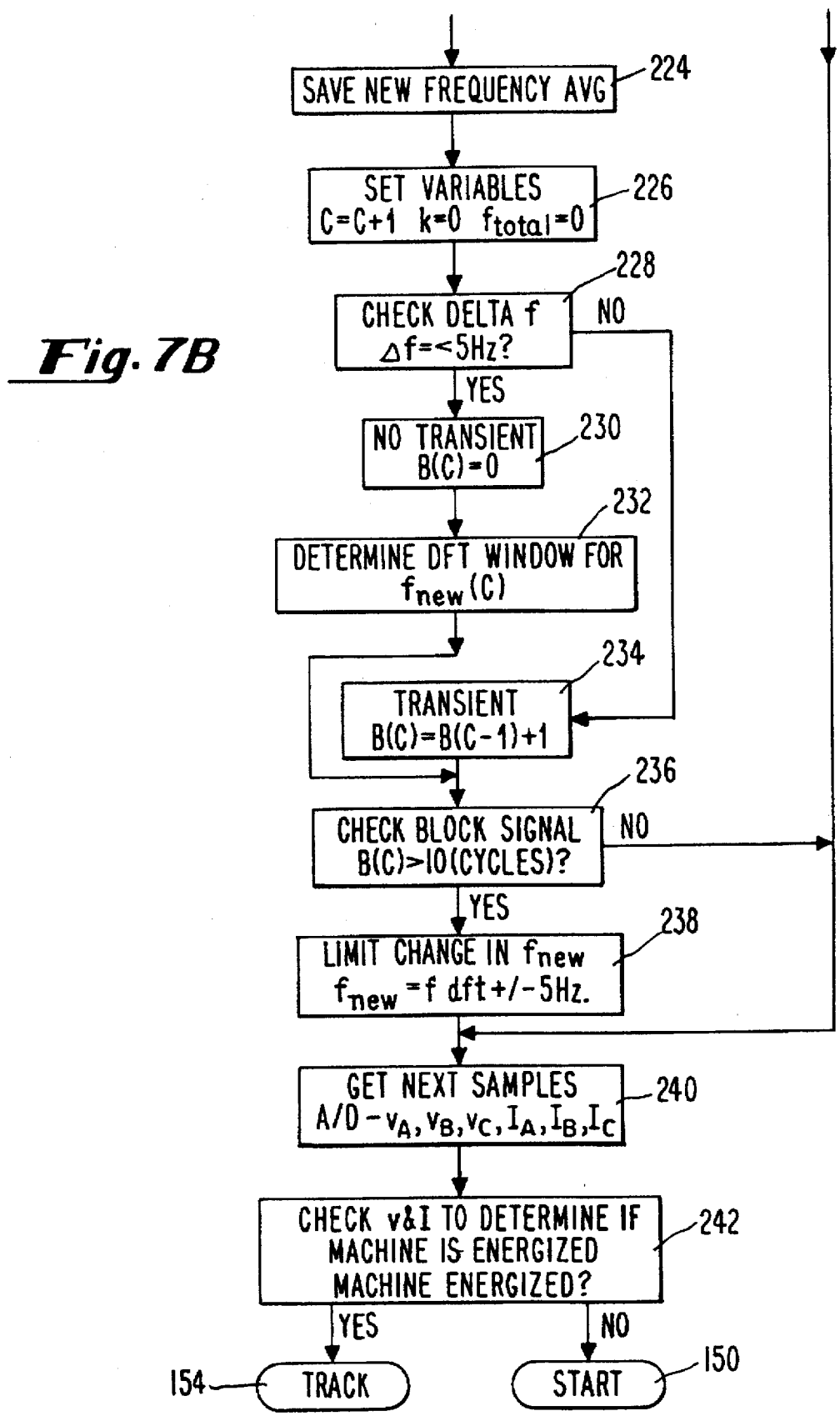

FIGS. 7A and 7B show a flow chart of the steps carried out during the frequency tracking state in a preferred embodiment of the present invention. As explained above, frequency tracking occurs during both the generator ramp up state and the tracking state. Since, the basic frequency tracking procedure used during both of these states is depicted in FIGS. 7A and 7B it is described first.

Figure 3:
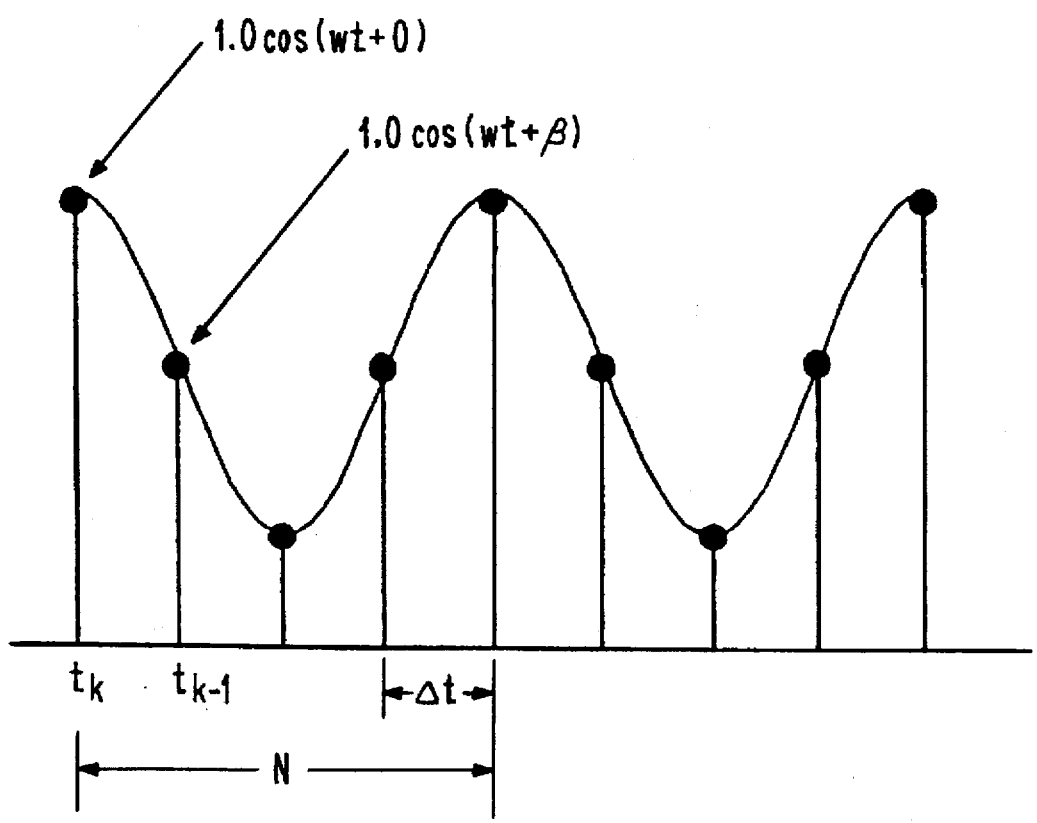
FIG. 3 shows the sampled waveform of a signal having a cosine waveform.
Figure 4:
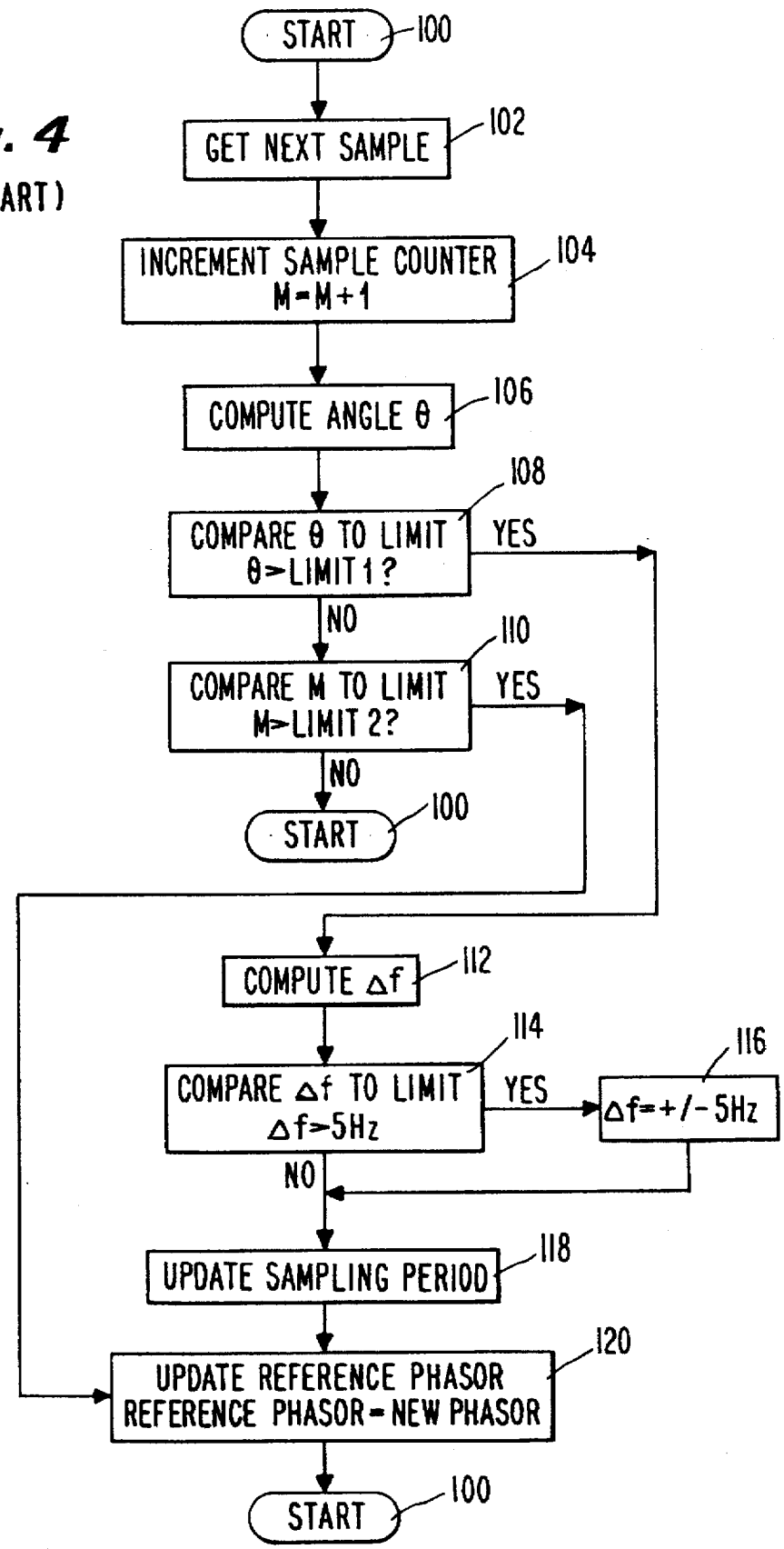
FIG. 4 shows a flowchart of the steps carried out by a frequency tracking procedure using a variable sampling interval.

The present invention differs from previous techniques in that the previous techniques use a fixed N-point DFT regardless of the estimated frequency. Specifically, the inventive method tracks the frequency and uses the frequency estimates to vary the DFT window (N), the number of samples per cycle. For example, referring back to FIG. 3, if $\Delta t$ is fixed such that each 60 Hz cycle has a DFT window of 32 samples per cycle, then $1/\Delta t$ becomes a predetermined fixed sampling rate of 1920 Hz at which the A/D converters sample all voltage and current signals regardless of the estimated frequency.

The DFT window according to the present invention is adjusted to be as close to 1 cycle of the signal as possible. However, since the sampling interval is fixed, the possible fundamental frequencies are discrete. Specifically, the fundamental frequency must have a period that is an integer value of the sampling interval. For a sampling interval of $\Delta t$, the possible frequencies are $1/(N\Delta t)$ where N is the number of samples per cycle.

In some applications it may be preferable to limit the number of samples actually used in the DFT. While the variable window is able to cover a large frequency range, the window length can become very large for real time computations. This problem is overcome by not utilizing every sample in the DFT window for the DFT computation, but rather only enough samples to satisfy the Nyquist criterion. In particular, a number of samples to be skipped ($N_{skip}$) for certain discrete frequencies may be selected so that the DFT does not use more than a maximum number of samples (Nmax). Accordingly, for a sampling interval of $\Delta t$, the possible frequencies are $1/(N_n*(N_{skip}+1)*\Delta t)$ where $N_n$ is the number samples in the DFT computation and the product $N_n*(N_{skip}+1)$ is the total number of samples per cycle at the corresponding discrete frequency $f_n$. More particularly, the product $N_n(N_{skip}+1)$ defines the DFT window.

For the case of $\Delta t=(1/60)/32$ (32 samples per cycle at 60 Hz), some of the possible discrete frequencies are listed in Table 1 below. According to a preferred embodiment of the present invention, a maximum number of samples Nmax of 38 is imposed for the DFT computation by skipping $N_{skip}$ samples between every sample used in the DFT as set forth in Table 1.

TABLE 1

| Frequency ($f_n$) | No. of DFT Samples ($N_n$) | No. of Samples to Skip ($N_{skip}$) |
|---|---|---|
| 87.2727 | 22 | 0 |
| 83.4783 | 23 | 0 |
| 80.0000 | 24 | 0 |
| 76.8000 | 25 | 0 |
| 73.8462 | 26 | 0 |
| 71.1111 | 27 | 0 |
| 68.5714 | 28 | 0 |
| 66.2069 | 29 | 0 |
| 64.0000 | 30 | 0 |
| 61.9355 | 31 | 0 |
| 60.0000 | 32 | 0 |
| 58.1818 | 33 | 0 |
| 56.4706 | 34 | 0 |
| 54.8571 | 35 | 0 |
| 53.3333 | 36 | 0 |
| 51.8919 | 37 | 0 |
| 50.5263 | 38 | 0 |
| 48.0000 | 20 | 1 |
| 45.7143 | 21 | 1 |
| 43.6364 | 22 | 1 |
| 41.7391 | 23 | 1 |
| 40.0000 | 24 | 1 |
| 38.4000 | 25 | 1 |
| 36.9231 | 26 | 1 |
| 35.5556 | 27 | 1 |
| 34.2857 | 28 | 1 |
| 33.1034 | 29 | 1 |
| 32.0000 | 30 | 1 |
| 30.9677 | 31 | 1 |
| 30.0000 | 32 | 1 |
| 29.0909 | 33 | 1 |
| 28.2353 | 34 | 1 |
| 27.4286 | 35 | 1 |
| 26.6667 | 36 | 1 |
| 25.9459 | 37 | 1 |
| 25.2632 | 38 | 1 |
| 24.6154 | 26 | 2 |
| 23.7037 | 27 | 2 |
| 22.8571 | 28 | 2 |
| 22.0690 | 29 | 2 |
| 21.3333 | 30 | 2 |
| 20.6452 | 31 | 2 |
| 20.0000 | 32 | 2 |
| 19.3939 | 33 | 2 |
| 18.8235 | 34 | 2 |
| 18.2857 | 35 | 2 |
| 17.7778 | 36 | 2 |
| 17.2973 | 37 | 2 |
| 16.842 | 38 | 2 |

Thus, for the frequency range of interest (about 16–88 Hz) in a preferred embodiment of the invention, the one-cycle DFT window would include 22 to 96 samples. Note that the largest frequency 'step' is at the higher frequencies and is about 4 Hz. However, since the actual frequency window is preferably adjusted to the nearest possible integer window, the frequency should be within one half of this value, about 2 Hz. This error should not significantly impact the DFT phasor estimate. Thus, use of the variable window allows for accurate frequency and phasor estimation with a fixed sampling interval. If desired, this error in the phasor estimate can be compensated for improved accuracy using equation (10).

Referring to FIGS. 7A and 7B, it is possible to generalize the steps of the procedure. Specifically, an N-point DFT is executed based on the sampled signals during each sampling interval resulting in one or more phasors related to the signals being sensed. The phasor angles are determined and compared to the phasor angles of phasors generated during the previous sampling interval. The resulting change in phasor angle ($\theta$) is used in equation (14) to solve for the instantaneous frequency (f+$\Delta$f). The instantaneous frequencies are averaged over the duration of the signal cycle resulting in an average cycle frequency $f_{new}(C)$. In a preferred embodiment, the discrete frequency closest to the average cycle frequency is used in equation (14) for the fundamental frequency f as is explained in detail below. Moreover, the DFT window is adjusted for the next cycle so that it corresponds to $N_n*(N_{skip}+1)$ in Table 1 for the discrete frequency closest to the average cycle frequency. The change in frequency from cycle-to-cycle, $\Delta$f, is then determined for the purpose of detecting transients.

Although the general tracking procedure in accordance with the present invention has just been described, FIGS. 7A and 7B show a preferred tracking procedure in accordance with the present invention. In particular, the adverse effects of harmonics are reduced and accurate tracking can be maintained despite the loss of one or two signals of the three-phase signal output from the generator and in the presence of transients.

Degradation due to harmonics is reduced in accordance with the present invention in a number of ways. First, line-to-line voltages are used in the tracking procedure. Where each of the three-phase voltage signals contains one or more harmonics, generating the line-to-line voltages can cancel some of those harmonics. In addition, each of the frequency estimates is averaged over a cycle of the signal thereby reducing the significance of any harmonic that may be present in the line-to-line voltages.

Thus referring to FIG. 7A, the tracking procedure begins at step 200 in which the sampling interval counter (k) is incremented after each sampling interval in which a set of signals (e.g., one sample from each of the following sensed signals $V_A$, $V_B$, $V_C$, $I_A$, $I_B$ and $I_C$) are received. If the received set of samples do not contain line-to-line voltage samples, then line-to-line samples are computed at step 202 as follows:

$$V_{AB}(k)=V_A(k)-V_B(k) \quad (16)$$

$$V_{BV}(k)=V_B(k)-V_C(k) \quad (17)$$

$$V_{CA}(k)=V_C(k)-V_A(k) \quad (18)$$

Then for each of the line-to-line voltages, an N-point DFT is performed at 202 resulting in 3 phasors representative of each instantaneous line-to-line voltage corresponding to the current interval k. The DFT is computed from equation (6) above.

Since in a preferred embodiment of the invention the DFT computation is limited to Nmax, some samples may be skipped in the DFT computation. Thus for a cycle in which the DFT window is $N_n*(N_{skip}+1)$, an $N_n$ point DFT is performed each sampling interval while $N_{skip}$ samples are left out of the DFT computation between each of the $N_n$ samples. Thus the DFT samples are selected based on the value of $N_n$ and $N_{skip}$ defined for the current cycle. For example, $N_n*(N_{skip}+1)$ samples can be stored in a circular buffer and updated each sampling interval. If $N_{skip}=1$, then every other sample in the buffer is selected and used in the DFT computation for the current cycle. When the buffer is updated, every other sample selected forms a new set of DFT inputs for the next DFT computation. It should be understood however that various techniques may be employed to select only $N_n$ samples for the DFT computation from the $N_n*(N_{skip}+1)$ samples in the cycle. For example, a larger number of samples than the present DFT window can be stored in the buffer, but $N_n$ samples can be selected from $N_n*(N_{skip}+1)$ samples for use in the DFT computation.

Figure 8:
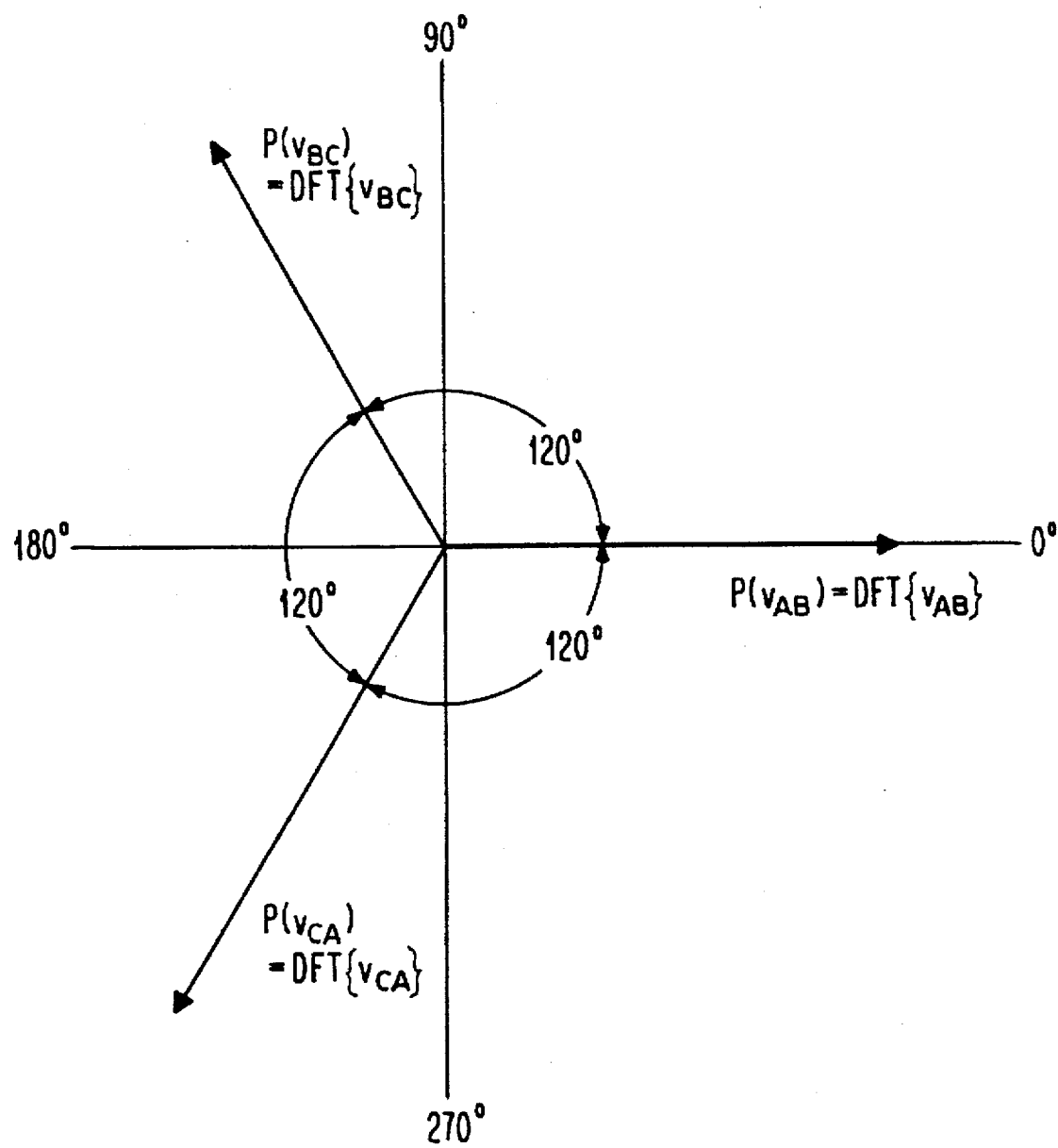
FIG. 8 shows a phasor diagram for a balanced system.

Power systems are known to have positive sequence components, negative sequence components and zero sequence components. FIG. 8 shows a phasor diagram for a balanced system. If all 3 phases of the power system are balanced then only positive sequence components are present. Since in a balanced system, the three line-to-line voltage phasors are equi-spaced in the phasor diagram such that the three phasors are separated by 120° as shown in FIG. 8. A positive sequence voltage phasor can be generated by shifting two of the phasors to overlie the remaining phasor. For example, if $P(V_{BC})$ is shifted $-120°$ and $P(V_{CA})$ is shifted $-240°$, then all three phasors have the same phasor angle $P(V_{AB})$ of 0°. Thus a single phasor representing the positive sequence components is generated at step 204 for a balanced three-phase system according to the following equation:

$$P(k)=\frac{1}{3}*(DFT\{V_{AB}(k)\}+a*DFT\{V_{BC}(k)\}+a^2*DFT\{V_{CA}(k)\}) \quad (19)$$

where $P(k)$ is the positive sequence phasor associated with the current sampling interval k and a is a constant phasor corresponding to the desired phase shift. For example, a is the complex value $(-0.5+jSQRT(3)/2)$ The change in phasor angle between $P(k)$ and $P(k-1)$ is then determined at step 206. From equation (13) above, it can be seen that the change in phasor angle, $\theta(k)$, is:

$$ARG\{P(k)/P(k-1)\} \quad (20)$$

which is simply the phase angle of the phasor generated during the current sampling interval k minus the phase angle of the phasor generated during the most previous or last sampling interval k-1.

The current phasor is then stored at step 208 for use in determining the change in phasor angle during the next sampling interval.

The instantaneous frequency is then generated at step 210 based on equation (14) solving for $f+\Delta f$ as follows:

$$f(k)=\theta(k)*f*N/2\pi \quad (21)$$

where $f(k)$ represents the instantaneous operating frequency during the kth sampling interval, f is the average cycle frequency determined during the last cycle and N is the DFT window. Since the number of samples per cycle N can vary from each sampling interval to the next, it is difficult to ascertain an integer number of samples per cycle corresponding to the average cycle frequency. Accordingly, f and N are preferably obtained from a table of discrete frequencies $f_n$ with corresponding DFT windows $N_n*(N_{skip}+1)$ such as Table 1 above. Rewriting equation (21) results in:

$$f(k)=\theta(k)*f_n*N_n*(N_{skip}+1)/2\pi \quad (22)$$

Utilizing the positive sequence component phasor in the tracking procedure renders the tracking more reliable in the event that one or even two of the line-to-line voltages are not detected during a particular cycle. So long as one of the line-to-line voltage phasors can be generated, the phase angle can be determined and in turn an instantaneous frequency can be estimated.

Steps 212, 214, 216 and 218 perform the frequency averaging over each cycle. The instantaneous frequencies are accumulated ($f_{total}$) at step 214. Because the DFT window used in DFT computation during the last sampling interval of the previous cycle may be different than the DFT window used in the DFT computation in the current cycle, the change in phasor angle determined at step 206 may be inaccurate for the first sampling interval of each cycle. Therefore in a preferred embodiment, step 212 serves to bypass the frequency accumulator for the first frequency estimate, $f(k=1)$. When the end of the cycle is reached as determined at step 216, the average cycle frequency $f_{new}(C)$ is generated by dividing the accumulated frequency by the number of accumulated instantaneous frequencies, which is preferably f-1.

The change in frequency, $\Delta f$, between the current cycle and the previous cycle is determined at step 220 by subtracting the average cycle frequency determined during the last cycle $f_{new}(C-1)$ from the average cycle frequency determined for the current cycle $f_{new}(C)$. Accordingly, the average cycle frequency determined during the current cycle, $f_{new}(C)$, is saved at step 224 for use during the next cycle determination of $\Delta f$. The counter k and frequency accumulator $f_{total}$ are reset at step 226 and the cycle counter C is also incremented at step 226.

For normal operation of the GPU, the frequency will not change significantly from cycle-to-cycle, and consequently $\Delta f$ is expected to be small, i.e. less than about 5 Hz. So long as $\Delta f$ is less than a predetermined threshold, e.g. 5 Hz, as determined at step 228, a block transient counter B(C) is reset to zero at step 230 and the next set of samples from the A/D converter are accepted at step 240.

The new DFT window is determined by identifying the discrete frequency in the lookup table that is closest in value to the average cycle frequency and defining the new DFT window equal to the number of samples per cycle ($N_n*(N_{skip}+1)$) corresponding to that frequency. For example, if $f_{new}(C)$ is 67 Hz, then from Table 1, the closest discrete frequency $f_n=66.209$ Hz. The corresponding number of samples per cycle $N_n$ is 29 with no samples being skipped, $N_{skip}=0$. Thus during the next cycle, the DFT window is N=29 samples per cycle. As a further example, if $f_{new}(C)$ is 39.5 Hz, the closest discrete frequency from Table 1 is 40 Hz. The total number of samples per cycle is 48 samples (1920 Hz/40 Hz). Since in the preferred embodiment, the DFT window is limited to a maximum of 38 samples, every other one of the 48 samples is skipped, $N_{skip}=1$, and the number of samples in the DFT window is 24*20 from Table 1 with only 24 samples used in the DFT computation.

If the generator is still energized as determined at step 242 by checking that the set of samples accepted are non-zero, then the procedure remains in the tracking state 154. If however, a "machine off condition" is detected, then the procedure returns to the initial state 150.

If a transient occurs, Δf may be greater than 5 Hz at step 238. In such a case, the DFT window is not updated at step 232. Instead the block transient counter is incremented at 234. It should be understood that the sign of the frequency difference may also be evaluated such that the increments correspond to Δf being less than −5 Hz or correspond to Δf being greater than 5 Hz. If during the next cycle Δf returns a value lower than the predefined threshold, then the block transient counter is reset at step 230. If the block transient counter is incremented a predetermined number of successive cycles, blocking the update of the DFT window will be disabled at step 238 by adjusting the frequency by the predetermined threshold. In the preferred embodiment, 5 Hz is used as the predetermined threshold and 10 cycles is used as the predetermined number of cycles that a DFT window update may be blocked. If the block counter does exceed the predetermined number of successive cycles, the discrete frequency $f_n$ that corresponds to the current DFT window N is adjusted by 5 Hz, +5 Hz if Δf is positive and −5 Hz if Δf is negative, at step 238. It is contemplated that in most situations frequency tracking can be restored through such adjustments.

It should be understood that once $N_n$ is determined, the current phasors can be estimated using the variable window DFT method in accordance with the invention.

Figure 9A:
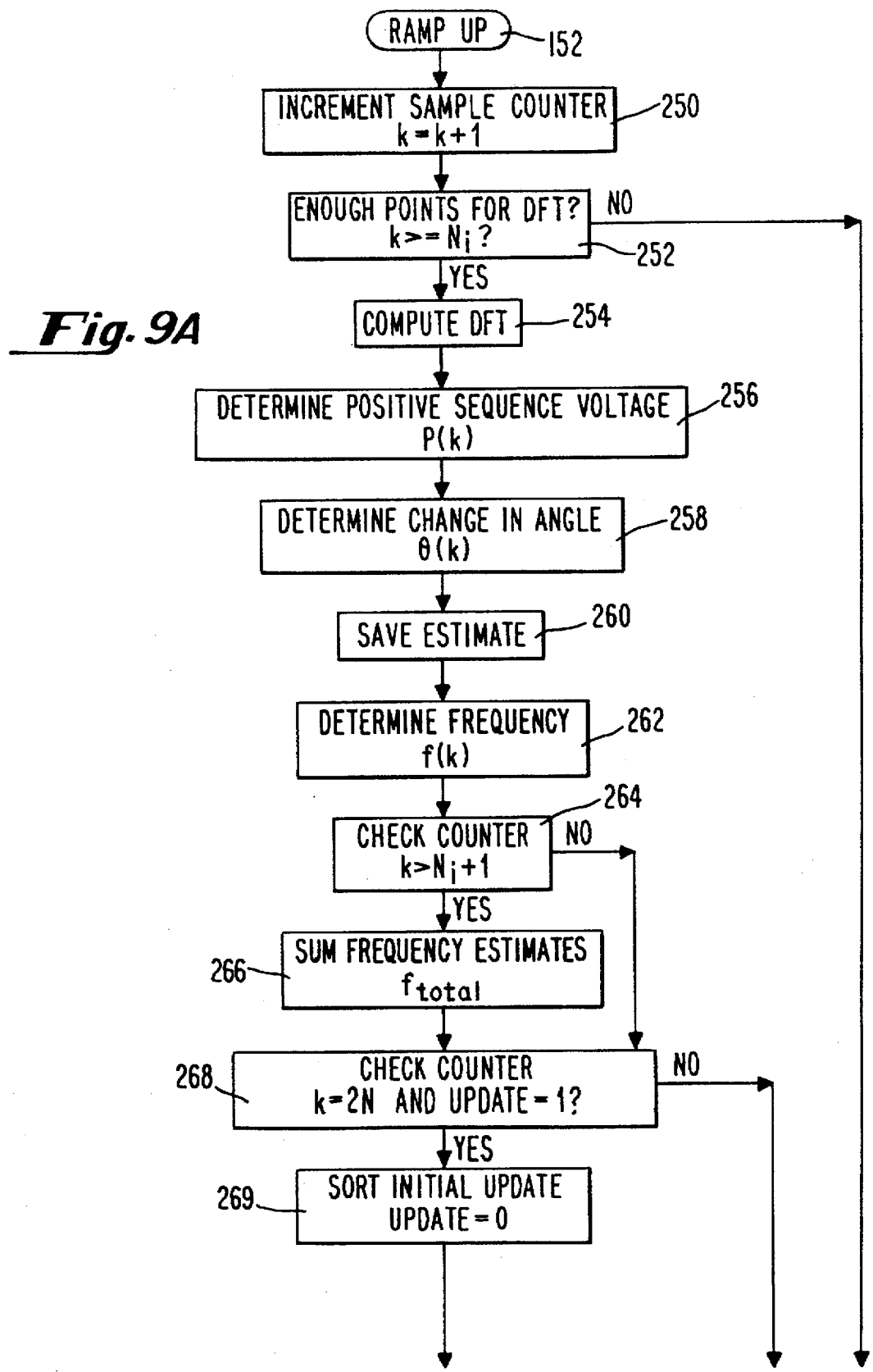
FIGS. 9A, 9B and 9C show a flow chart of the steps carried out during the generator ramp up state in accordance with a preferred embodiment of the invention.
Figure 9B:
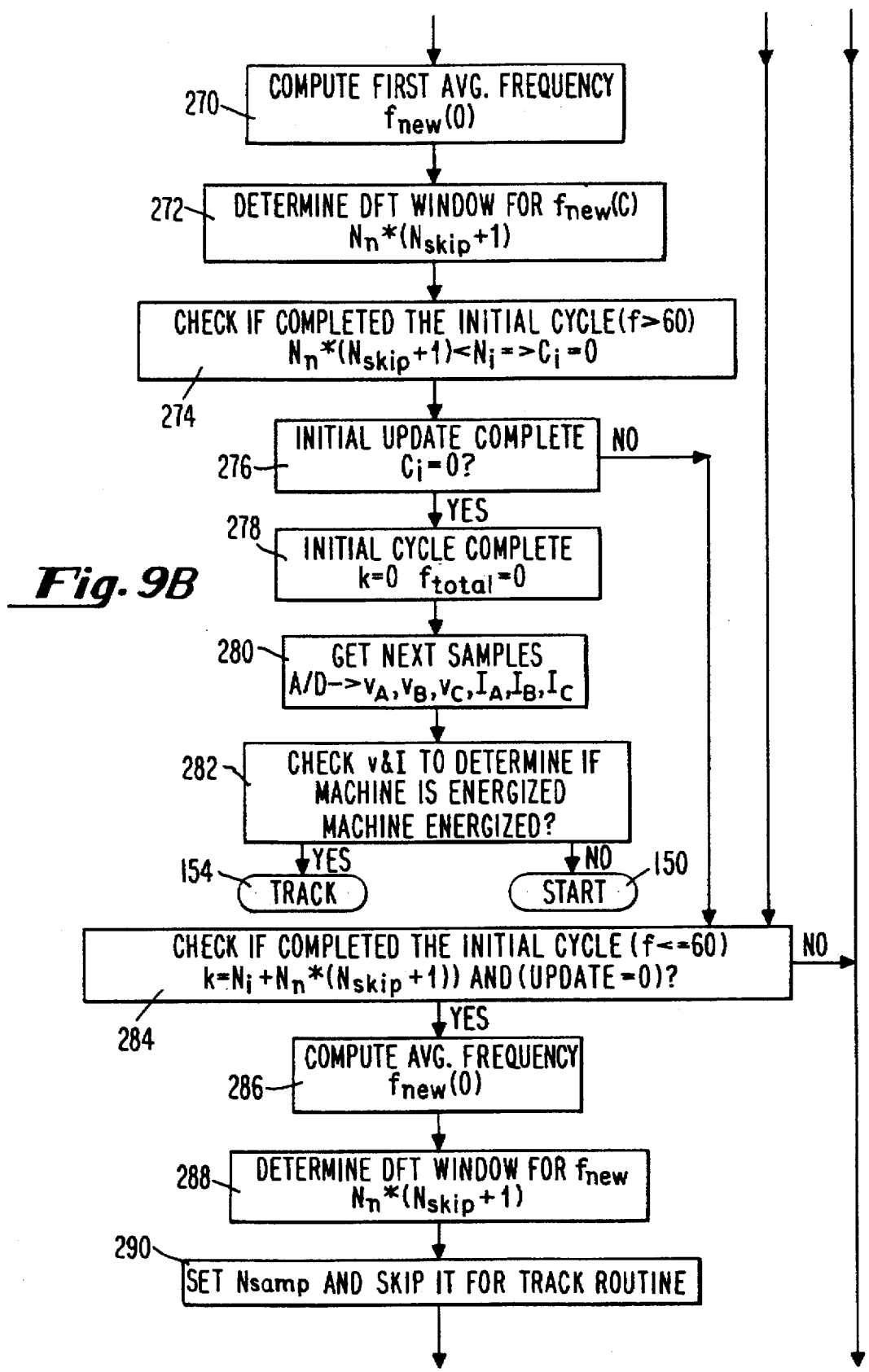
Figure 9C:
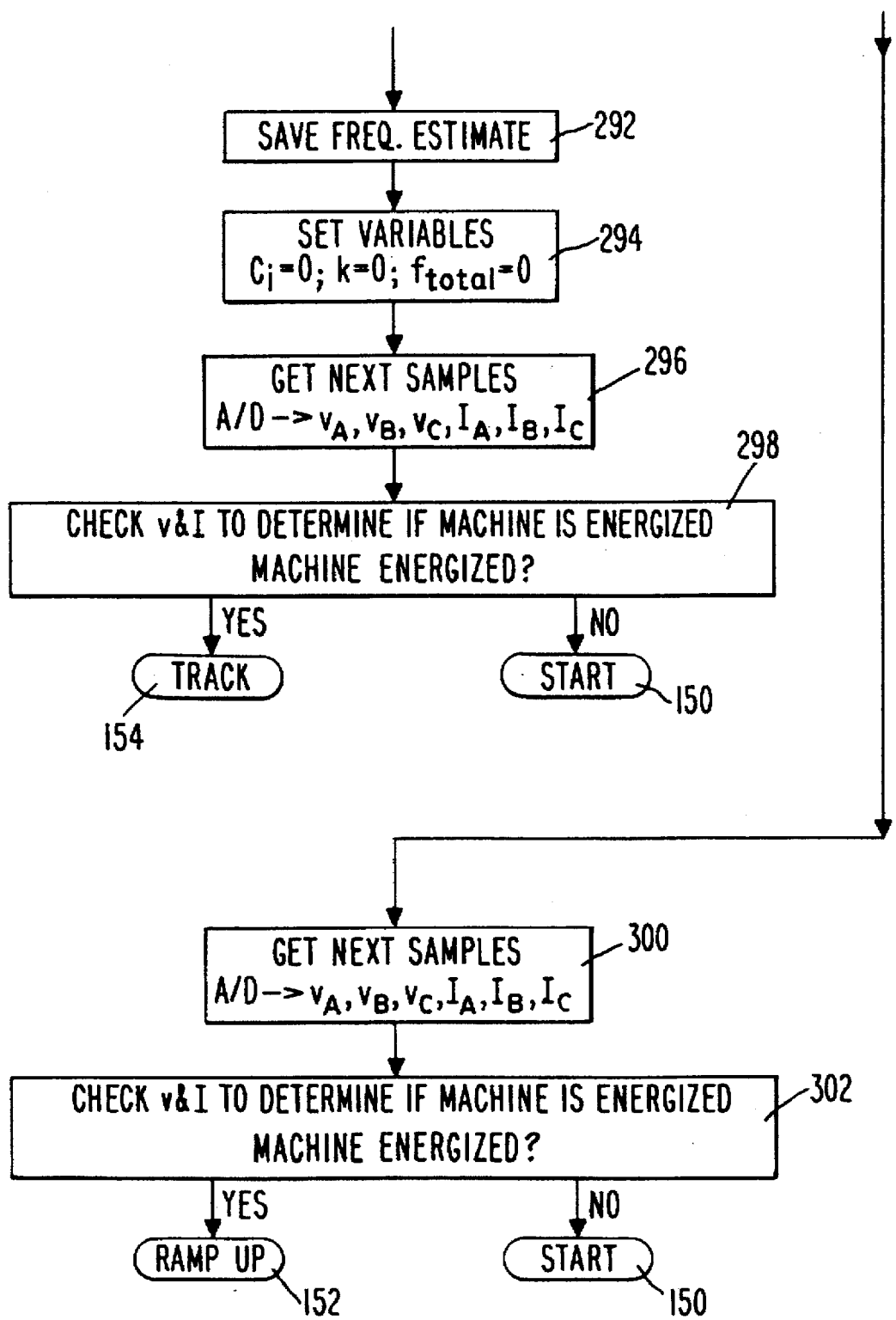

FIGS. 9A, 9B and 9C show a flow chart of the steps carried out during the generator ramp up state according to a preferred embodiment of the invention. Once the generator is energized, the interval counter k is incremented at step 250. During the first cycle of $N_i$ samples, the initial DFT window, is preferably obtained so that the line-to-line voltage phasors can be estimated using a DFT with a window of $N_i$. Accordingly, $N_i$ samples are obtained before tracking begins.

Once $N_i$ samples have been obtained as determined at step 252, the line-to-line voltage phasors are estimated at step 254, the positive sequence phasor is generated at step 256, the change in phase angle is determined at step 258, and the positive sequence phasor is saved at step 260. Each step 252, 254, 256, 258 and 260 is carried out in substantially the same manner as described hereinabove in connection with steps 202, 204, 206, 208 and 210 shown in FIG. 7A, respectively. Using the example of $N_i$=32 samples as the initial DFT window, 32 samples would be acquired before the DFT and subsequent steps could be executed.

The instantaneous frequency estimates for the first cycle in which frequency estimates are generated (e.g. k=32 to k=64) are then averaged at steps 266 and 270 as explained above in connection with steps 214 and 218 shown in FIG. 7A, respectively. As also explained above it is preferable to eliminate the first estimate of each cycle from the average cycle frequency. Accordingly, step 264 precludes the first frequency estimate from being included in the accumulated frequency ($f_{total}$) and $f_{total}$ is divided by only $N_i$−1 estimates at step 270. Once this initial DFT window can be determined, the initial update flag is updated at step 269 to reflect that the end of the first DFT window has been estimated (UPDATE=0). If the DFT window has not been updated, it is updated at step 272 by identifying the closest discrete frequency $f_n$ to the average cycle frequency and defining the new DFT window as the product of $N_n*(N_{skip}+1)$ corresponding to the identified discrete frequency.

After the average cycle frequency is estimated, it is preferably compared with the fundamental frequency, 60 Hz in the example, at step 274. Specifically, if $N_n*(N_{skip}+1)$ is less than $N_i$, the operating frequency has not yet ramped up to the fundamental frequency and more samples are required to complete the cycle. However, if the average cycle frequency is at least the fundamental frequency, then a sufficient number of samples have been acquired for a complete cycle. Thus the initial DFT window used to generate the frequency estimates was sufficient. Therefore, the initial cycle flag $C_i$ is set to 0 at step 274 indicating that the generator has ramped up and tracking can commence.

The initial cycle flag is checked at step 276 and if $C_i$=0, the first cycle is complete and the parameters are reinitialized at step 278. The next set of samples are acquired at step 280. The generator is checked to ensure that it is still energized at step 282 and then proceeds to commence the tracking procedure described above. If the generator is no longer energized as determined at step 282 the procedure returns to the initial state 150.

If the average cycle frequency is less than the fundamental frequency as determined at step 274, then a sufficient number of samples have not been acquired for generating the phasors since a complete cycle has not lapsed. Therefore, a new set of samples are acquired at 300, the generator checked at 302, and the DFT window $(N_n*(N_{skip}+1))$ estimated based on the initial update is used for a number of additional frequency estimates. For example, if the DFT window from the initial update $(N_n*(N_{skip}))$ is 40 samples, but included only the initial $N_i$ frequency estimates which is 32 in this example, then 8 additional samples should be acquired so that the DFT window of 40 samples can be achieved. Accordingly, frequency estimates are generated at step 262 and accumulated at step 266 for 8 additional sampling intervals as determined at step 284. Note prior to the initial update, the average frequency is estimated (at step 270) when k=64 (2*$N_i$), but after the initial update, the average frequency is not estimated (at step 286) until k=70 $(N_i+N_n*(N_{skip}+1))$ which includes 8 additional sampling intervals.

Once the average cycle frequency is estimated at step 286, a new DFT window is determined at step 288 by identifying the closest discrete frequency to that average cycle frequency as is explained above. The new DFT window is saved for use during the first cycle of the tracking procedure at step 290. Since the operating frequency of the generator is expected to be increasing during the ramp up state, the new DFT window should be lower than the DFT window determined at the initial update. However, if that is not the case, in a preferred embodiment the new DFT window is set to the initial DFT window and saved for use during the first cycle of the tracking procedure at step 290.

The new average cycle frequency is then saved as $f_{new}$ (C=0) at step 292 for use in determining Δf during the first cycle of the tracking procedure. The sampling interval counter and frequency accumulator are reset to 0 at step 294. The next set of samples is acquired at step 296 and will be used during the first sampling interval of the tracking procedure. The set of samples is checked to ensure that the generator is still energized at step 298 and if so the ramp up procedure exits to the tracking state 154. If the generator is no longer energized, the ramp up procedure exits to the initial state 150.

Figure 1:
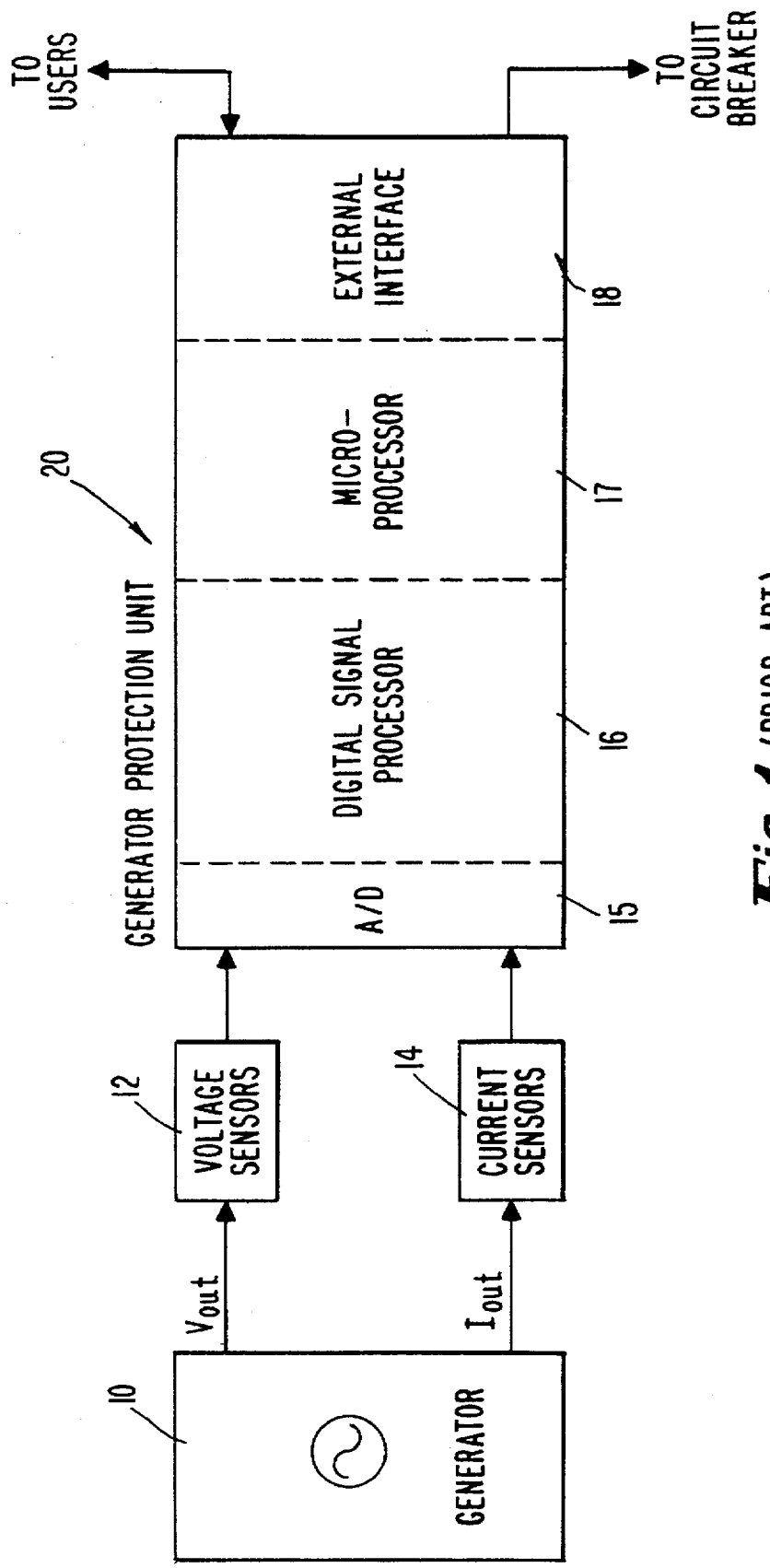
FIG. 1 shows a block diagram of a generator protection system.
Figure 2:
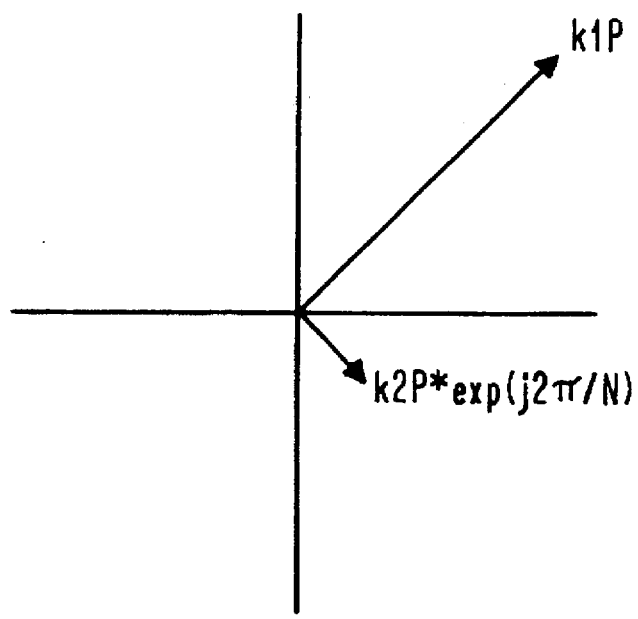
FIG. 2 shows an exemplary phasor diagram.
Figure 10:
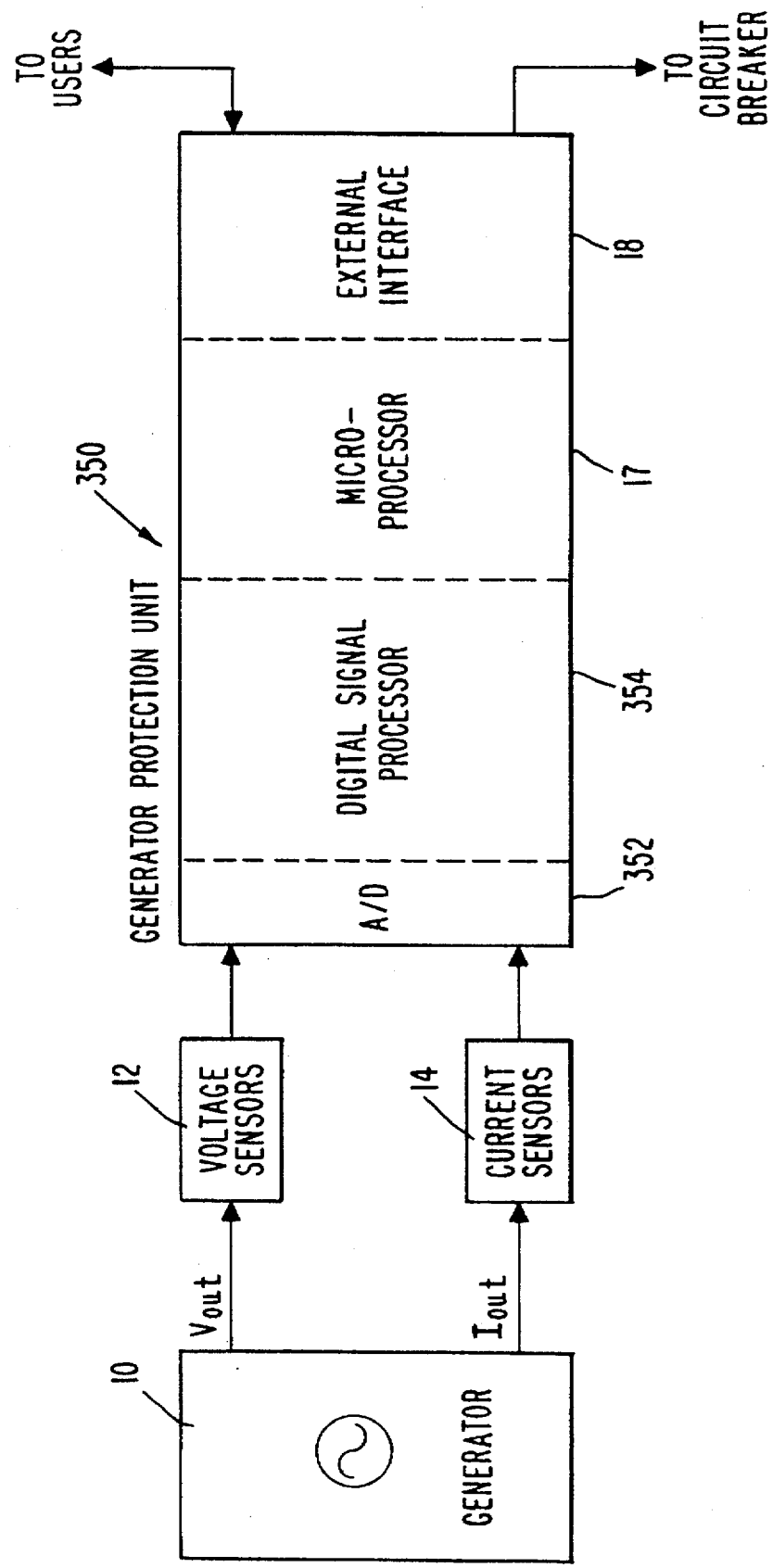
FIG. 10 shows a block diagram of a generator protection system according to the present invention.

FIG. 10 shows a block diagram of a generator protection system in accordance with the present invention. The GPU 350 is programmed in accordance with the phasor estimation and frequency tracking procedures as described hereinabove. The generator 10, current sensor 14, voltage sensor 12, microprocessor 17 and external interface 18 function in a substantially identical manner as described in connection with FIG. 1. The A/D converter 352 is programmed to sample at a fixed sampling interval unlike the A/D converter 15 shown in FIG. 1 which samples at a variable rate. The DSP 354 is specifically programmed in accordance with the present invention to generate phasors and track the operating frequency of the generator by adjusting the DFT window each cycle rather than the sampling interval.

It should be understood from the foregoing that the present invention simplifies storage and display requirements associated with most digital protection systems in that the sampled data does not need to be stored or displayed along with the sampling interval for which the data was acquired because the sampling interval according to the present invention remains constant. Consequently, further data analysis and manipulation is substantially simplified. Moreover, the present invention allows the use of time-domain protection schemes which rely on fixed sampling intervals for accurate fault detection as a primary or back up function.

While the invention has been described and illustrated with reference to specific embodiments, those skilled in the art will recognize that modification and variations may be made without departing from the principles of the invention as described hereinabove and set forth in the following claims.

We claim:

1. A method of tracking the frequency of a signal having an estimated frequency, comprising the steps of:

sampling the signal at a predetermined fixed sampling rate to generate a sequence of N successive samples;

determining for each successive sample the phase angle of the signal based on the N successive samples;

determining the change in phase angle of the signal based upon the difference between the phase angle corresponding to a current sample and the phase angle corresponding to a most previous sample;

estimating the instantaneous frequency of the signal based upon the change in phase angle; and adjusting N based on the estimated frequency.

2. The method of claim 1, wherein the step of determining the phase angle of the signal comprises the step of:

performing an N-point DFT for each successive sample thereby generating a phasor indicative of the instantaneous magnitude, angular frequency, and phase angle of the signal.

3. The method of claim 2, wherein the change in phase angle is the argument of the phasor corresponding to the current sample to the phasor corresponding to the most previous sample.

4. The method of claim 1, further comprising the steps of:

defining a range of discrete frequencies $f_n$ such that each discrete frequency in the range is the predetermined fixed sampling rate divided by a multiple integer of samples $N_n$, wherein the multiple integer of samples is the number of samples per cycle of the corresponding discrete frequency based on the predetermined fixed sampling rate.

5. The method of claim 4, wherein the instantaneous frequencies are averaged over each cycle resulting in an average cycle frequency, the instantaneous frequency corresponding to a current sample f(k) is estimated according to the following relationship:

$$f(k)=\theta*(f_n*N_n/2\pi)$$

where $\theta$ is the change in phasor angle, $f_n$ is the discrete frequency closest to the average cycle frequency and $N_n$ is the number of samples per cycle corresponding to the discrete frequency.

6. The method of claim 5, wherein a maximum number of successive samples Nmax is defined, for each $N_n$ that does not exceed Nmax all of the $N_n$ samples are utilized in determining the phase angle of the signal, for each $N_n$ greater than Nmax, a predetermined number of samples $N_{skip}$ are skipped so that the N samples used in determining the phase angle of the signal exclude $N_{skip}$ samples between each of the N samples and $N_n$ is reduced by the factor of ($N_{skip}+1$), and wherein the instantaneous frequency is estimated according to the following relationship:

$$f(k)=\theta*(f_n*N_n*(N_{skip}+1)/2\pi).$$

7. The method of claim 1, wherein the step of determining the phase angle of the signal is carried out using an N-point DFT, the method further comprising the steps of:

generating a predetermined pairing of discrete frequencies fn and corresponding number of samples $N_n$ such that $f_n*N_n$ is equal to the fixed predetermined sampling rate;

estimating the instantaneous frequency for each sample in a cycle of the signal;

averaging the instantaneous frequencies over each cycle to produce an average cycle frequency;

identifying the discrete frequency closest to the average cycle frequency; and selecting the number of samples $N_n$ corresponding to the discrete frequency so identified and defining the number of samples N to be the number of samples $N_n$.

8. A method of tracking the operating frequency of an electrical generator in a generator protection unit (GPU), wherein the generator outputs a plurality of voltage signals to the GPU, the method comprising the steps:

sampling the voltage signals at a predetermined fixed rate to produce a set of voltage samples at N successive sampling intervals where N is the number of samples per cycle of the voltage signals;

generating a phasor representative of the positive sequence voltage of the plurality of voltage signals during each successive sampling interval;

determining a change of the angle of the phasor generated during a current sampling interval and the angle of a phasor generated during a most previous sampling interval;

estimating the instantaneous frequency of the generator based on the change of the angle; and adjusting N based on the instantaneous frequencies.

9. The method of claim 8, further comprising the step off averaging the instantaneous frequencies over a cycle of the voltage signals to produce an average cycle frequency, wherein N is adjusted based on the average cycle frequency.

10. The method of claim 9, wherein the step of generating the phasor is carried out using at least one N-point DFT, the method further comprising the steps of:

generating a predetermined pairing of discrete frequencies $f_n$ and corresponding number of samples $N_n$ such that $f_n*N_n$ is equal to the fixed predetermined sampling rate;

identifying the discrete frequency closest to the average cycle frequency; and selecting the number of samples $N_n$ corresponding to the discrete frequency so identified and defining the number of samples N to be the number of samples $N_n$ for the next cycle.

11. The method of claim 9, further comprising the steps of:

determining the difference between the average cycle frequency associated with a current cycle and the average cycle frequency associated with a most previous cycle and defining the difference as a frequency shift;

incrementing a transient block counter if the frequency shift is greater than a predetermined threshold; and adjusting the average cycle frequency by a predetermined frequency adjustment when the transient block counter exceeds a predetermined value.

12. The method of claim 11, wherein the predetermined threshold and the predetermined frequency adjustment are each about 5 Hz.

13. The method of claim 11, wherein the transient block counter is reset to zero each time the frequency shift does not exceed the predetermined threshold and wherein the predetermined value is ten.

14. The method of claim 8, wherein the step of generating the phasor is carried out using at least one N-point DFT, the method further comprising the steps of:

generating a predetermined pairing of discrete frequencies $f_n$ and corresponding number of samples $N_n$ such that $f_n*N_n$ is equal to the fixed predetermined sampling rate.

15. The method of claim 8, wherein the operating frequency of the generator is tracked when the operating frequency is between about 16 Hz and 87 Hz.

16. The method of claim 15, wherein the maximum number of successive samples does not exceed 38 samples.

17. The method of claim 8, further comprising the following steps:

defining a fundamental frequency and an initial number of samples per first cycle $N_i$ associated with the fundamental frequency;

determining, whether the instantaneous frequency corresponding to $N_i$ is less than the fundamental frequency during the first cycle;

averaging the instantaneous frequencies over the first cycle to produce a first average cycle frequency;

determining a number of additional sampling intervals required to complete one cycle of the first average cycle frequency;

estimating the instantaneous frequency for each additional sampling interval and defining each as an additional instantaneous frequency; and averaging the instantaneous frequencies and additional instantaneous frequencies to produce an updated average cycle frequency, wherein N is adjusted based on the updated average cycle frequency.

18. A generator protection system for analyzing voltage and current signals output from a generator wherein the voltage and current signals are monitored by respective voltage and current sensors to produce a plurality of signals representative of voltage and current characteristics of the generator, the generator protection system comprising:

sampling means for receiving an input of the plurality of signals and sampling the plurality of signals at a predetermined fixed rate to provide an output of sampled signals;

a processing means coupled to the sampling means and receiving an input of the sampled data, the processing means estimating the operating frequency of the generator by carrying out at least one N-point DFT where N corresponds to the DFT window to provide an instantaneous frequency estimate, the processing means varying N based on the instantaneous frequency estimate.

19. The system of claim 18, wherein the operating frequency of the generator is estimated during a ramp up period after the generator is energized.

20. The system of claim 18, wherein the processing means averages each of the instantaneous frequency estimates over an interval corresponding to one cycle of the operating frequency and defining the same as an average cycle frequency and wherein the processing means further updates the duration of the interval so that the duration of a current interval is based on the average cycle frequency estimated during a most previous interval.

\* \* \* \* \*

UNITED STATES PATENT AND TRADEMARK OFFICE
CERTIFICATE OF CORRECTION

PATENT NO. : 5,721,689
DATED : February 24, 1998
INVENTOR(S) : David Hart et al.

It is certified that error appears in the above-indentified patent and that said Letters Patent is hereby corrected as shown below:

Col. 2, line 60, "$f_a$" should read --$f_s$--

Col. 2, line 66, "$f_a$" should read --$f_s$--

(Col. 16, line 52) Claim 9, line 1, "off" should read -- of: --.

Signed and Sealed this

Nineteenth Day of May, 1998

*Attest:*

BRUCE LEHMAN

*Attesting Officer*    *Commissioner of Patents and Trademarks*